(12) United States Patent
Chen

(10) Patent No.: US 6,367,542 B1
(45) Date of Patent: Apr. 9, 2002

(54) HEAT SINK ASSEMBLY WITH DUAL FANS

(75) Inventor: Chun-Chi Chen, Taipei (TW)

(73) Assignee: Foxconn Precision Components Co., Ltd. (TW)

(*) Notice: Subject to any disclaimer, the term of this patent is extended or adjusted under 35 U.S.C. 154(b) by 0 days.

(21) Appl. No.: 09/853,981

(22) Filed: May 11, 2001

(30) Foreign Application Priority Data

Mar. 27, 2001 (TW) .................................. 90204674 U

(51) Int. Cl.[7] .............................. F28F 7/00; F24H 3/02
(52) U.S. Cl. ..................... 165/80.3; 165/121; 165/122
(58) Field of Search ............................. 165/80.3, 121, 165/122, 125, 126; 361/696, 697; 257/722

(56) References Cited

U.S. PATENT DOCUMENTS

| | | | |
|---|---|---|---|
| 4,997,034 A | * 3/1991 | Steffen et al. | 165/122 |
| 5,132,780 A | * 7/1992 | Higgins, III | 165/80.3 |
| 5,597,034 A | * 1/1997 | Barker, III et al. | 165/80.3 |
| 5,763,969 A | * 6/1998 | Metheny et al. | 310/62 |
| 6,176,299 B1 | * 1/2001 | Hanzlik et al. | 165/80.3 |
| 6,219,242 B1 | * 4/2001 | Martinez | 165/121 |

* cited by examiner

*Primary Examiner*—Henry Bennett
*Assistant Examiner*—Tho V Duong

(57) ABSTRACT

A heat sink assembly includes a heat sink (10), an internal fan (20), a fan frame (30), and an external fan (40). The heat sink includes a base (12) and a fin member (14) attached to the base. The fin member includes a central portion (142), and a plurality of fins (144) extending radially from the central portion. A central cavity (146) is defined in the fin member, surrounded by the fins. The internal fan is received in the cavity and supported by the central portion. The fan frame has an opening (34) defined therein, and is mounted on the heat sink. The external fan is mounted on the fan frame such that it covers the opening. The internal fan accelerates airflow from upper portions of the fin member to lower portions of the fin member.

17 Claims, 3 Drawing Sheets

HEAT SINK ASSEMBLY WITH DUAL FANS

BACKGROUND OF THE INVENTION

1. Field of the Invention

The present invention relates to a heat sink assembly, and particularly to a heat sink assembly having both internal and external fans.

2. Description of Related Art

Many electronic devices such as central processing units (CPUs) generate a lot of heat. The heat must be efficiently removed from such devices, to ensure normal operation. Conventionally, a heat sink with extruded fins is mounted on an electronic device to remove heat therefrom. Sometimes, a fan is coupled with the heat sink to enhance air convention.

Unfortunately, manufacturing of heat sinks by extrusion limits the height of the fins produced. As electronic devices become more and more powerful, they generate more and more heat during operation. Extruded heat sinks are becoming increasingly unable to provide the levels of heat removal required by contemporary electronic devices. Moreover, fins of most typical heat sinks are arranged in regular linear arrays which unduly obstruct airflow between the fins. Furthermore, single-fan systems are becoming increasingly unable to provide the levels of heat removal required by contemporary electronic devices.

Thus, an improved heat sink assembly which overcomes the above-mentioned problems is strongly desired.

SUMMARY OF THE INVENTION

Accordingly, an object of the present invention is to provide a heat sink assembly having enhanced airflow.

A further object of the present invention is to provided a heat sink assembly which removes heat from an electronic device more efficiently.

In order to achieve the objects set out above, a heat sink assembly of the present invention comprises a heat sink, an internal fan, a fan frame and an external fan. The heat sink comprises a base and a fin member attached to the base. The fin member comprises a central portion, and a plurality of fins extending radially from the central portion. A central cavity is defined in the fin member, surrounded by the fins. The internal fan is received in the cavity and supported by the central portion. The fan frame has an opening defined therein, and is mounted on the heat sink. The external fan is mounted on the fan frame such that it covers the opening. The internal fan accelerates airflow from upper portions of the fin member to lower portions of the fin member.

Other objects, advantages and novel features of the invention will become more apparent from the following detailed description when taken in conjunction with the accompanying drawings.

DETAILED DESCRIPTION OF THE INVENTION

Figure 1:
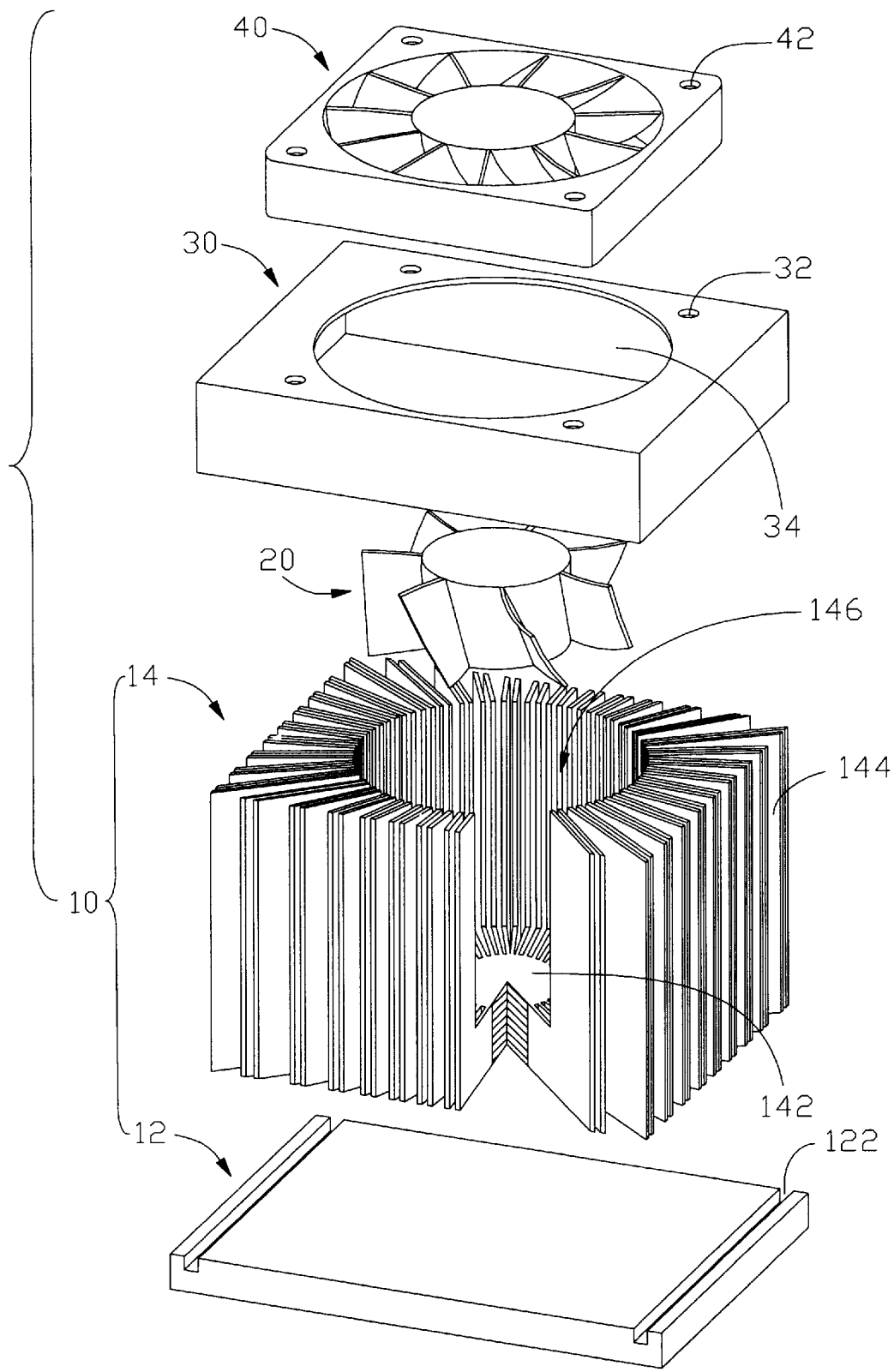
FIG. 1 is an exploded view of a heat sink assembly in accordance with the present invention, with some fins on a heat sink thereof being partly cut away for clarity.

Reference will now be made to the drawing figures to describe the present invention in detail.

Referring to FIG. 1, the heat sink assembly comprises a heat sink 10, an internal fan 20, a fan frame 30 and an external fan 40. The internal fan 20 is received in the heat sink 10. The external fan 40 is mounted on the heat sink 10 using the fan frame 30.

The heat sink 10 comprises a base 12 and a fin member 14. The base 12 is a rectangular plate. A pair of slots 122 is defined in a top surface of the base 12 at opposite sides thereof, for coupling with clips (not shown) and thereby attaching the heat sink assembly to an electronic device (not shown). The fin member 14 has a cylindrical central portion 142. A plurality of fins 144 extends radially from the central portion 142, for facilitating airflow from the heat sink 10 to exterior surroundings. Each fin 144 is L-shaped so that air from the internal fan 20 will easily flow downwardly. The fins 144 extend higher than the central portion 142, thereby defining a cylindrical cavity 146. The cavity 146 receives the internal fan 20 therein. The cavity 146 is coaxial with the central portion 142, and has a diameter larger than that of the central portion 142.

The fan frame 30 is box-shaped. A lower portion of the fan frame 30 is open, for receiving the fin member 14 of the heat sink 10. The fan frame 30 defines four first through holes 32 in a top surface thereof, in the vicinity of each of four corners of the top surface respectively. An opening 34 is defined in a central portion of the top surface of the frame 30, corresponding to the cavity 146 of the heat sink 10. The external fan 40 defines four second through holes 42 at each of four corners thereof respectively, corresponding to the first through holes 32 of the fan frame 30.

Figure 2:
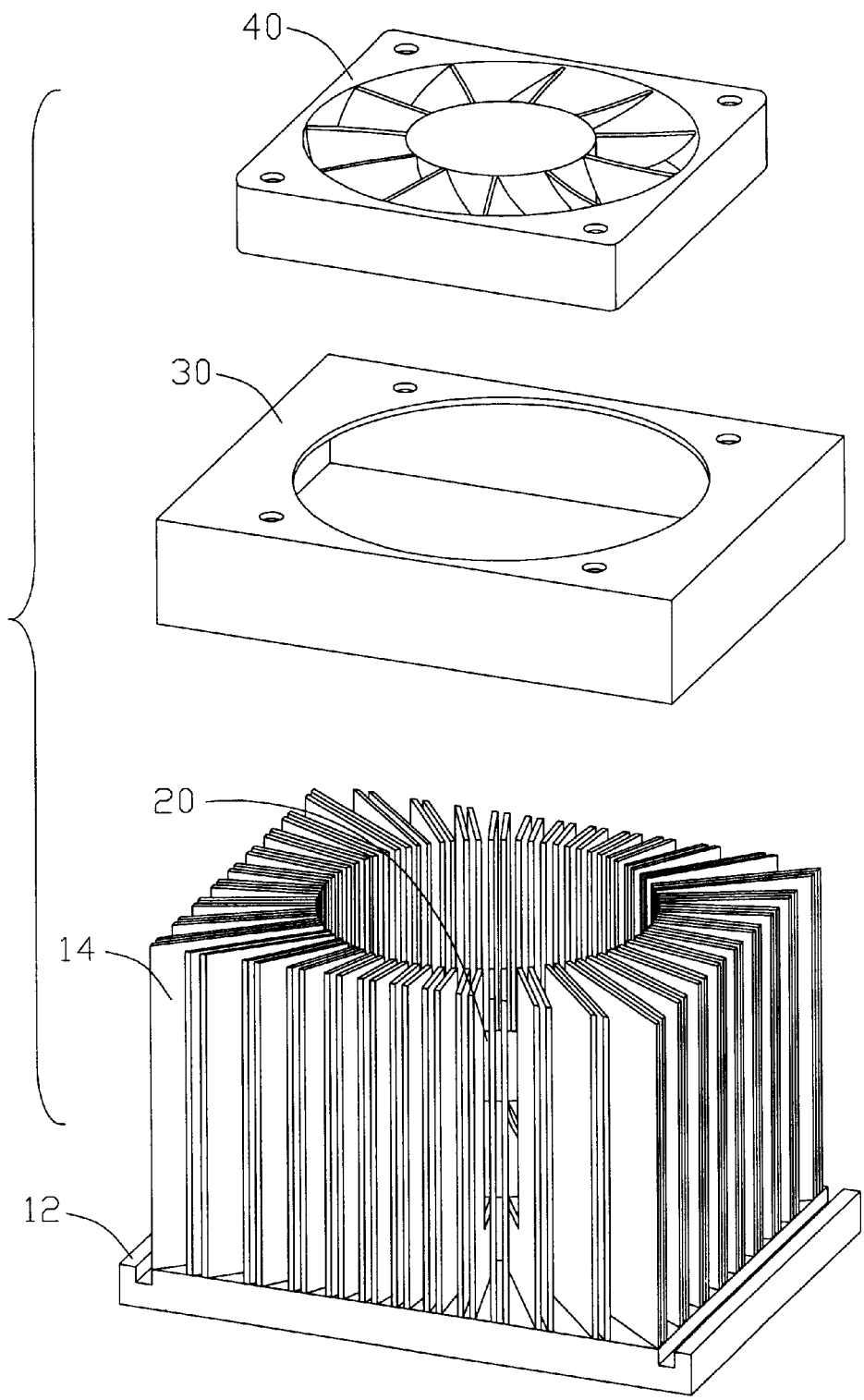
FIG. 2 is a partly assembled view of FIG. 1.
Figure 3:
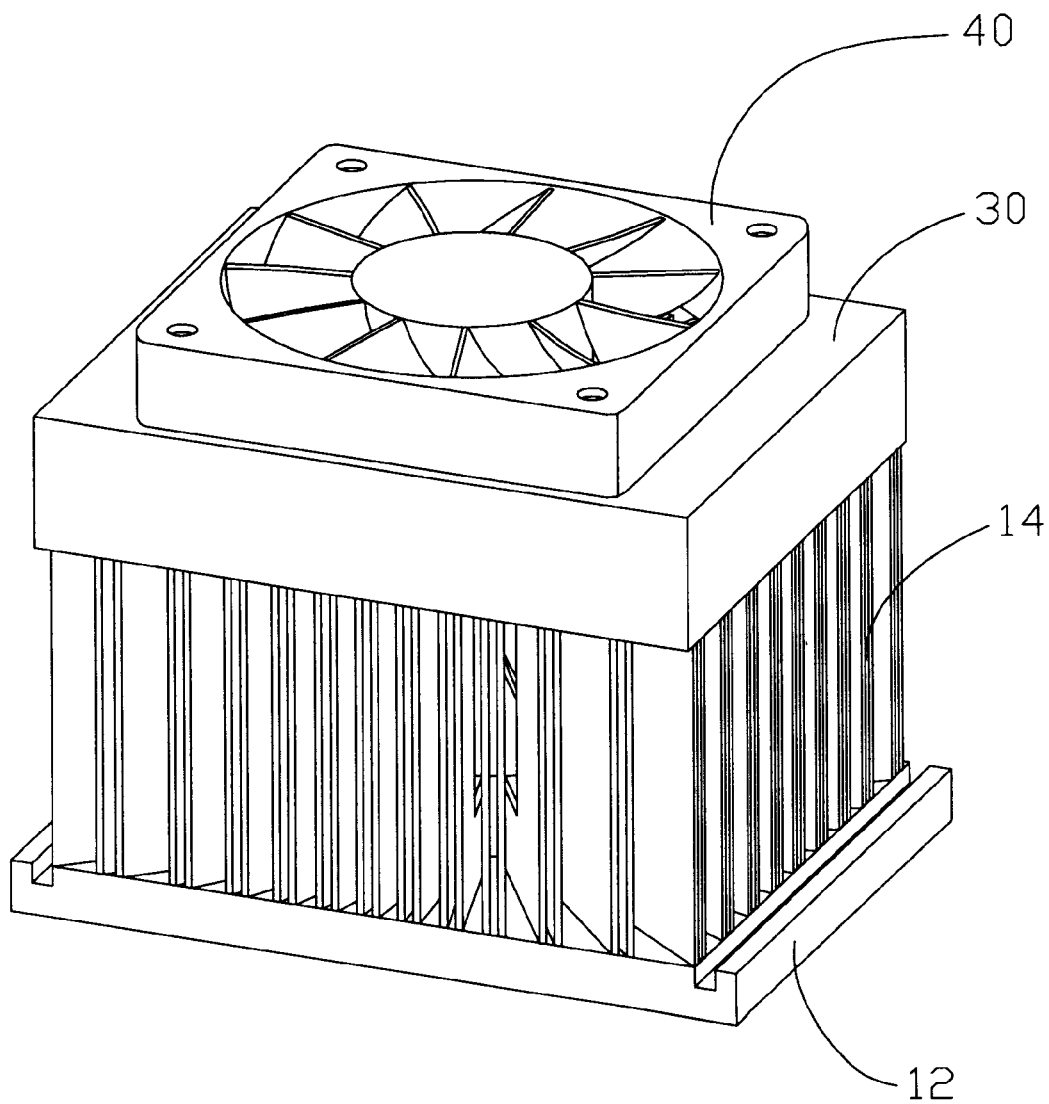
FIG. 3 is a fully assembled view of FIG. 1.

Referring also to FIGS. 2 and 3, in assembly, the fin member 14 is attached to the base 12 of the heat sink 10 between the slots 122 by soldering or insert molding. Alternatively, the heat sink 10 is constructed as a single unit. The internal fan 20 is received in the cavity 146, and is attached on the central portion 142 of the heat sink 10. The fan frame 30 is placed to cover over an upper portion of the fin member 14. The external fan 40 is mounted on the fan frame 30, such that it completely covers the opening 34 of the fan frame 30. In this position, the second through holes 42 of the external fan 40 are aligned with the first through holes 32 of the fan frame 30. Four screws (not shown) are respectively inserted through the second and first through holes 42, 32, such that the fan frame 30 and the external fan 40 are secured to the fin member 14. Thus, the heat sink assembly is assembled together.

In use, cooling air enters the external fan 40 from an exterior of the external fan 40. The air passes into the cavity 146 of the heat sink 10. The internal fan 20 accelerates airflow from upper portions of the fin member 14 to lower portions of the fin member 14. The air then exits the heat sink 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly, comprising:

a heat sink comprising a base and a fin member attached to the base, the fin member comprising a central portion and forming a plurality of fins extending radially from the central portion, a cavity being defined in the fin member and surrounded by the fins;

an internal fan being received in the cavity of the heat sink and supported by the central portion;

a fan frame mounted on the fin member, the fan frame defining an opening therein; and an external fan mounted on the fan frame.

2. The heat sink assembly as described in claim 1, wherein the cavity of the fin member is generally cylindrical.

3. The heat sink assembly as described in claim 2, wherein the cavity of the fin member is coaxial with the central portion of the fin member.

4. The heat sink assembly as described in claim 1, wherein the cavity of the fin member has a diameter larger than that of the central portion of the fin member.

5. The heat sink assembly as described in claim 1, wherein the internal fan is attached on the central portion of the fin member.

6. The heat sink assembly as described in claim 1, wherein each fin is L-shaped for facilitating air flow.

7. The heat sink assembly as described in claim 1, wherein the fins extend higher than the central portion of the fin member.

8. The heat sink assembly as described in claim 1, wherein the fan frame defines a plurality of first through holes approximating to each corner thereof, and wherein the external fan defines a plurality of second through holes in alignment with the first through holes, the first and second through holes being adapted to receive a plurality of screws to secure the external fan and fan frame to the fin member.

9. A heat sink assembly comprising:

a heat sink comprising a base and a fin member supported on the base, the fin member comprising a central portion, a plurality of fins extending radially from the central portion, the fins being L-shaped and cooperating with the central portion to define a cavity therebetween;

an internal fan received in the cavity of the heat sink and attached on the central portion;

an external fan; and a fan frame supporting the external fan thereon and together covering the cavity of the heat sink.

10. The heat sink assembly as claimed in claim 9, wherein the cavity is generally cylindrical.

11. The heat sink assembly as claimed in claim 9, wherein the cavity is coaxial with the central portion of the fin member.

12. A heat sink assembly, comprising:

a fin member having a central portion and a plurality of fins extending outwardly from the central portion, a central cavity being defined between the central portion and the fins, in which the fins are higher than the central portion;

an internal fan being received in the cavity and surrounded by the fins; and an external fan being situated over the fin member and overlapping the cavity of the fin member.

13. The heat sink assembly as claimed in claim 12, further comprising a fan frame interposed between the fin member and the external fan for supporting the external fan on the fin member.

14. The heat sink assembly as claimed in claim 12, wherein the fins extend radially from the central portion.

15. The heat sink assembly as claimed in claim 12 further comprising a base on which the fin member is vertically mounted.

16. The heat sink assembly as claimed in claim 12, wherein the cavity is cylindrical and coaxial with the central portion of the fin member.

17. The heat sink assembly as claimed in claim 12, wherein the fins each have an L-shaped configuration.

\* \* \* \* \*